United States Patent
Wu

(10) Patent No.: US 6,329,833 B1
(45) Date of Patent: Dec. 11, 2001

(54) SYSTEM AND METHOD FOR AUTOMATICALLY MEASURING INPUT VOLTAGE LEVELS FOR INTEGRATED CIRCUITS

(75) Inventor: Yiding Wu, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/256,964

(22) Filed: Feb. 24, 1999

(51) Int. Cl.$^7$ .......................... G01R 31/26; G01R 31/02; G01R 31/28; H02H 3/05; G11C 29/00
(52) U.S. Cl. .................. 324/765; 324/763; 324/158.1; 714/724; 714/727; 714/25; 365/200
(58) Field of Search .................. 324/765, 763, 324/158.1, 73.1; 714/724, 727, 25; 365/200, 201; 702/64, 117, 118, 119, 120

(56) References Cited

U.S. PATENT DOCUMENTS

| | | | |
|---|---|---|---|
| 4,862,071 | * 8/1989 | Sato et al. | 324/73.1 |
| 4,929,888 | * 5/1990 | Yoshida | 714/736 |
| 5,091,884 | * 2/1992 | Kagami | 365/200 |
| 5,826,004 | * 10/1998 | Bae | 714/25 |
| 6,060,896 | * 5/2000 | Ma et al. | 324/763 |
| 6,163,864 | * 6/1998 | Bhavsar et al. | 714/727 |

* cited by examiner

Primary Examiner—Glenn W. Brown
Assistant Examiner—Wasseem H. Hamdan
(74) Attorney, Agent, or Firm—Patrick T. Bever

(57) ABSTRACT

A measurement system is provided for measuring Vil and Vih of integrated circuits (ICs). The measurement system includes a computer that transmits a control signal to a power supply, which in turn transmits a corresponding applied voltage to the input terminal of an IC. The output terminal of the IC is connected to a parallel port of the computer, thereby forming a feedback loop that allows automatic measurement of Vil and Vih. A method for measuring Vil and Vih utilizing the measurement system includes the steps of transmitting a control signal from a computer to a power supply that causes the power supply to transmit a corresponding applied voltage to the input terminal of the IC, measuring (detecting) a logic level of an output signal transmitted from the IC to the computer, and systematically adjusting the control signal in response to the detected logic level while repeating the steps of transmitting and detecting until the voltage level of the applied voltage is substantially equal to the Vil or the Vih of the IC. In one embodiment, a binary-search approach is utilized to generate the Vil and Vih values in a minimum number of iterations.

17 Claims, 6 Drawing Sheets

SYSTEM AND METHOD FOR AUTOMATICALLY MEASURING INPUT VOLTAGE LEVELS FOR INTEGRATED CIRCUITS

FIELD OF THE INVENTION

The present invention relates to integrated circuits (ICs), and more particularly to systems and methods for testing digital integrated circuits.

BACKGROUND OF THE INVENTION

Most electronic systems include multiple digital integrated circuits (ICs), such as PLDS, ASICs, memory devices, and processors, that are mounted on printed circuit boards (PCBs). Each PCB includes a pattern of printed metal lines (e.g., copper tracks) formed on a board of insulating material. The ICs are typically soldered to the copper tracks at specific locations on the PCB, and the copper tracks provide signal paths for transmitting binary signals between the ICs of the electronic system.

Before ICs are soldered to a PCB to form an electronic system, the ICs are typically tested to verify that all of the ICs properly communicate with each other. In particular, the ICs are tested to verify that the binary output signals (logic high and logic low) from a first IC are properly interpreted at the input terminals of a second IC. This testing involves measuring the low-level input voltage (Vil) and high-level input voltage (Vih) of each IC of the system. Vil and Vih are direct current (DC) characteristics of all digital ICs. The Vil of an IC represents the maximum allowable input voltage that will be interpreted as a logic low (e.g. 0) by the IC. The Vih of an IC represents the minimum allowable input voltage that will be interpreted as a logic high (e.g., 1) by the IC. For example, a particular IC may interpret all input signals below 0.8 Volts as having logic low values, and all input signals above 2.0 Volts as having logic high values. Accurate measurement of Vil and Vih are important for predicting whether various ICs in the same electronic system can understand each other correctly.

FIG. 1 is a diagram showing a conventional system for measuring the Vil and Vih of an IC. The system requires a human operator 110 to manually control a power supply 120 using manual controls 122 and a display 125 such that power supply 120 transmits a desired test voltage from output terminal 127 to the input terminal 133 of an IC device-under-test (DUT) 130. Input terminal 133 of DUT 130 is connected to an output terminal 138 (i.e., such that the logic input signal at input terminal 133 produces a corresponding logic output signal at output terminal 138). Output terminal 138 of DUT 130 is probed by an oscilloscope 140 such that the output signal from DUT 130, which is generated in response to the applied voltage from power supply 120, is transmitted to an input terminal 142 of oscilloscope 140. Oscilloscope 140 includes a screen 145 from which human operator 110 visually observes a graphical representation of the output signal from DUT 130. Test data related to the Vil and Vih testing of DUT 130 is then manually entered by human operator 110 into a computer 150 using an input device (e.g., keyboard) 152 and a display 155.

FIG. 2 is a flow diagram showing the conventional method of measuring the Vil of DUT 130 (Vih is measured in a similar manner). For Vil measurements, an initial test voltage is set to VCC (e.g., 3.3 Volts) (Step 210). After connecting DUT 130 between power supply 120 and oscilloscope 140, as shown in FIG. 1, human operator 110 manually adjusts power supply 120 to apply the initial test voltage to DUT 130 (Step 220). The initial test voltage is significantly higher than the expected Vil for DUT 130 to assure that DUT 130 generates a logic high output signal (e.g., VCC). Human operator 110 then verifies that the output signal from DUT 130 is high by observing the graphical representation on screen 145 of oscilloscope 140 (Step 230). When the output signal from DUT 130 is high ("N" in Step 240), human operator 110 mentally calculates an incrementally decreased applied voltage (Step 250). This incremental voltage is calculated by subtracting a resolution value from the previously used applied test voltage. Human operator 110 selects the resolution value (i.e., degree of accuracy). After mentally calculating the adjusted applied voltage, human operator 110 manually adjusts power supply 120 to generate the adjusted applied voltage (Step 220) and observes the output signal from DUT 130 on screen 145 of oscilloscope 140 (Step 230). The process of incrementally decreasing the applied voltage and observing the output signal is repeated until a logic low output signal (e.g., ground or 0 Volts) is observed on screen 145 ("Y" in Step 240). This change in the output signal indicates that the actual Vil for DUT 130 is within the resolution range of the most recent applied voltage. This final applied voltage is then assigned as Vil for DUT 130 (Step 260), and human operator 110 manually enters this value into computer 150 (Step 270).

In practice, several problems are created by the conventional method of measuring vil and Vih. As indicated in FIG. 1, human operator 110 is used as a feedback control and must divide his attention between power supply 120, oscilloscope 140, and computer 150. If the applied voltage is changed too fast, operator 110 may miss the actual Vil/Vih voltage level. Further, because human operator 110 must manually enter the Vil/Vih values into computer 150, a rapid measurement pace may result in translation errors. Conversely, if the voltage is changed too slowly, the repetitious and meticulous measurement process becomes tedious for human operator 110, who may then make mental errors. This problem becomes even more significant when the measurement process is used to measure Vil/Vih for multiple terminals on multiple DUTs under varying conditions of VCC and temperature. Further, the significant amount of operator time to perform these measurements can significantly increase the overall cost of an electronic system incorporating DUT 130.

Other problems arise that are attributed to the use of oscilloscope 140 (see FIG. 1). If the ground level of power supply 120 is not exactly the same as the ground level of oscilloscope 140, then measurements read from screen 145 of oscilloscope 140 can be inaccurate by the difference between the two ground levels. For this reason, it is difficult to maintain a consistent and high resolution for all Vil and Vih measurements over all combinations of DUTs and terminals of an electronic system using the conventional method. This problem arises even when very expensive state-of-the-art instruments are used.

What is needed is a system and a method for measuring Vil and Vih that overcome the problems described above that are associated with the conventional system and method.

SUMMARY OF THE INVENTION

The present invention is directed to a measurement system for automatically measuring the Vil and Vih of integrated circuits (ICs). The measurement system includes a computer and a power supply that are connected to respective output and input terminals of a IC device-under-test (DUT), thereby forming a closed loop. The computer transmits a control signal to a power supply, which in turn applies a corresponding test voltage to the input terminal of an IC device-under-test (DUT). An output terminal of the DUT is connected to the parallel port of the computer. Automatic measurement of the Vil and Vih of the DUT is performed by operating the computer to systematically alter the control signal applied to the power supply, and detecting the logic state at the output terminal of the DUT. Because control signals are transmitted from, and DUT output signals read by, the computer, the need for the human operator feedback used in the conventional method is eliminated, thereby reducing the risk of error. Further, because the output signal from the DUT is transmitted to the computer, the need for the oscilloscope used in the conventional measurement system is also eliminated, thereby further reducing the possibility of measurement error.

The present invention is also directed to a method for measuring Vil and Vih utilizing the above-described measurement system. The method includes the steps of transmitting a control signal from the computer to the power supply that causes the power supply to transmit a corresponding applied test voltage to the input terminal of the DUT, detecting (measuring) a logic level of an output signal transmitted from the DUT to the computer, and systematically adjusting the control signal in response to the detected logic level while repeating the steps of transmitting and detecting until the voltage level of the applied voltage is substantially equal to the Vil or the Vih of the DUT. The applied voltage is substantially equal to the Vil/Vih when a difference between the applied voltage and the Vil/Vih is equal to or less than a selected resolution (e.g., 10 milli-Volts).

In one embodiment, the step of transmitting the control signal includes passing the control signal from a central processing unit of the computer to a general purpose interface bus (GPIB) of the computer, and the step of detecting the logic level of the output signal includes passing the output signal from the integrated circuit through a parallel port of the computer to the central processing unit of the computer.

In another embodiment, the step of systematically adjusting the control signal includes incrementally changing the control signal such that the power supply increases or decreases the voltage level of the applied voltage by a predetermined amount until the logic level of the detected output voltage changes from a first logic level (e.g., high or low) to a second logic level (e.g., low or high).

In yet another embodiment, the step of systematically adjusting the control signal includes using a binary-search operation that includes comparing the logic level of the output signal with a predetermined voltage level. If the logic level of the output signal is less than the predetermined voltage level, then the control signal is changed such that the power supply increases the voltage level. Conversely, if the logic level of the output signal is greater than the predetermined voltage level, then the control signal is changed such that the power supply decreases the voltage level of the applied voltage. In either case, a value APPLIED_VOLTAGE of the control signal is calculated using the equation:

APPLIED_VOLTAGE=(MAX+MIN)/2, where MAX and MIN are variables having initial values set to VCC and ground voltage levels of the integrated circuit, respectively. When the control signal is changed to increase the power supply, the value of MIN is changed to equal the APPLIED_VOLTAGE value, and then the APPLIED_VOLTAGE value is recalculated using the new value of MIN. When the control signal is changed to decrease the power supply, the value of MAX is changed to equal the APPLIED_VOLTAGE value, and then the APPLIED_VOLTAGE value is recalculated using the new value of MAX. The values of MAX and MIN are changed and APPLIED_VOLTAGE is recalculated repeatedly until either a difference between MAX and MIN is less than a predetermined resolution amount, or until APPLIED_VOLTAGE has been recalculated a predetermined number of times.

DETAILED DESCRIPTION OF THE DRAWINGS

The present invention is directed to a system and method for measuring Vil and Vih of an integrated circuit (also referred herein to as a device-under-test, or DUT). The system and method was specifically designed for measuring the Vil and Vih of devices in the XC4000™ series of field programmable gate arrays (FPGAs) that are produced by Xilinx, Inc., of San Jose, Calif. However, the system and methods described below may be beneficially utilized to measure Vil and Vih for other types of FPGAs, such as the XC2000™, XC3000™, XC5000™, Spartan™, and Virtex™ FPGAs, which are also produced by Xilinx, Inc., as well as other types of programmable logic devices (PLDs) and non-programmable digital ICs. Therefore, the appended claims should not necessarily be limited to a particular IC type.

Figure 3:
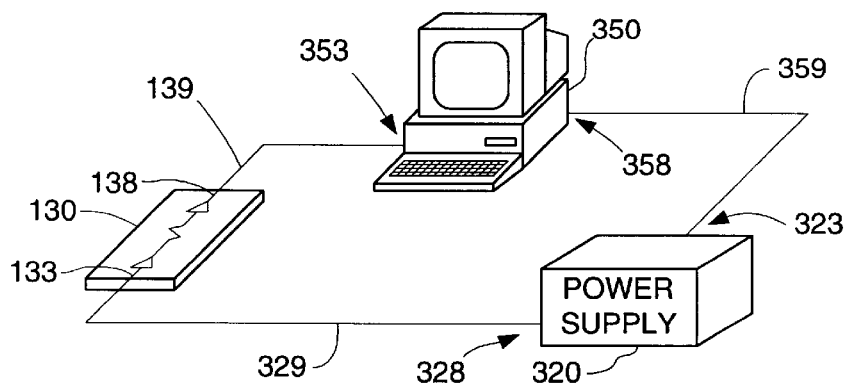
FIG. 3 is a simplified diagram showing a system for measuring Vil and Vih of an integrated circuit in accordance with an embodiment of the present invention.
Figure 4:
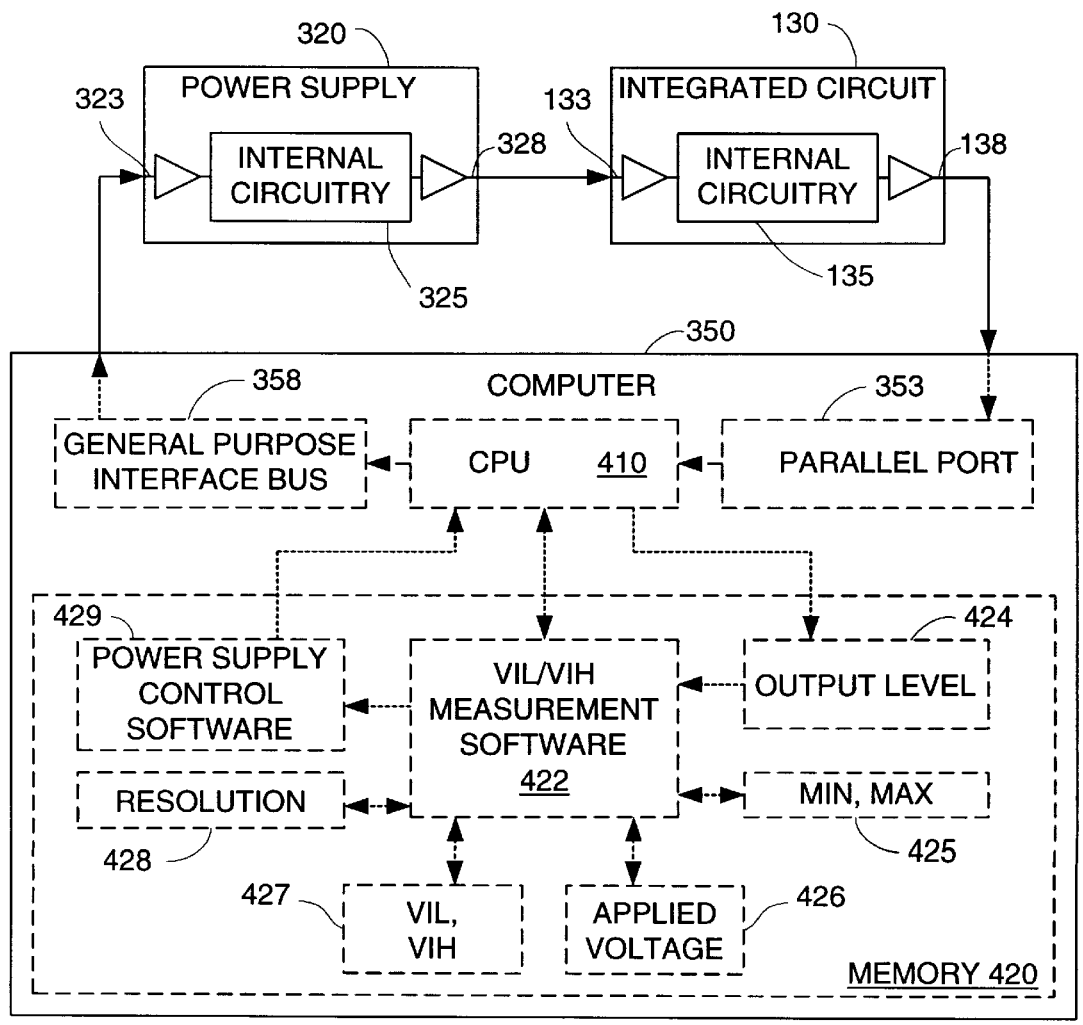
FIG. 4 is a block diagram showing the system of FIG. 3 in additional detail.

FIG. 3 is a simplified diagram showing a system for measuring Vil and Vih of an IC (DUT) 130. FIG. 4 is a block diagram showing the system of FIG. 3 in additional detail.

Referring to FIG. 4, DUT 130 includes an input terminal 133, an output terminal 138, and internal circuitry 135 connected between the input terminal and the output terminal. In the discussion below, internal circuitry 135 operates such that when an applied voltage at input terminal 133 is less than the Vil of DUT 130, a corresponding logic low output signal is reliably generated by internal circuitry 135 at output terminal 138. Conversely, when the applied voltage at input terminal 133 is greater than Vih, a corresponding logic high output level is reliably generated at output terminal 138. Such an association between input and output terminals can be generated, for example, by suitably programming an XC4000™ series FPGA using known techniques.

Referring to FIG. 3, in accordance with the present invention, a measurement system includes a computer 350 and a power supply 320 that are connected with DUT 130 to form a closed loop. In particular, computer 350 generates a control signal that is transmitted on an output terminal, such as a general purpose interface bus (GPIB) 358, to an input terminal 323 of power supply 320 via a first cable 359. In response to the control signal transmitted from computer 350, power supply 320 transmits an applied voltage from an output terminal 328 to input terminal 133 of DUT 130 via a second cable 329. In one embodiment, second cable 329 includes a banana plug that is connected to power supply 320, and a minigrabber that attaches to input lead 133 of DUT 130. In response to the applied voltage, DUT 130 generates an output signal at output terminal 138 that is transmitted to an input terminal, such as the parallel port 353 of computer 350, via a third cable 139. In one embodiment, third cable 139 is a DB25 (Male/Female) parallel extension cable with pins 1 to 25 wired straight through. The male connector of third cable 139 plugs into parallel port 353 of computer 350, and the female connector of third cable 139 plugs into an associated male connector provided on a PCB upon which DUT 130 is mounted. Thus, cables 359, 329, and 139 connect computer 350, power supply 320, and DUT 130 to form a continuous loop.

Referring to FIG. 4, power supply 320 includes internal circuitry 325 connected between input terminal 323 and output terminal 328. Internal circuitry 325 generates the applied test voltage transmitted to input terminal 133 of DUT 130 in response to the control signal received from computer 350. The voltage level of the applied voltage is determined by a digital value provided in the control signal. For example, a control signal transmitted from computer 350 may include a digital value representing an applied voltage of 3 Volts. When this control signal is received by power supply 320, internal circuitry 325 reads the digital value, and then transmits an applied voltage having a voltage level of 3 Volts to DUT 130. An example of a suitable power supply 320 is an HP E3631A Triple Output DC Power produced by Hewlett Packard of Palo Alto, Calif.

Referring again to FIG. 4, computer 350 includes parallel port 353, a central processing unit (CPU) 410, a memory 420 and GPIB 358. CPU 410 is, for example, a Pentium 200 Mhz processor running the Windows NT operating system. Other platforms and operating systems can also be utilized. Memory 420 is graphically illustrated as including several files that store operating procedures and data used to control CPU 410. Specifically, memory 420 includes Vil/Vih measurement software 422 and various memory files including an output level file 424, a MIN and MAX file 425, an APPLIED_VOLTAGE file 426, a Vil and Vih file 427, and a RESOLUTION file 428. Vil/Vih measurement software 422 controls CPU 410 to detect a logic level of the signal output from DUT 130, to systematically adjust the APPLIED_VOLTAGE value of the control signal stored in file 426 in accordance with stored procedures, and to transmit the control signal to power supply 320 via GPIB 358. Vil/Vih measurement software 422 repeats the detecting, adjusting, and transmitting process until the applied voltage generated by power supply 320 is substantially equal to the Vil (or the Vih) of DUT 130.

Figure 1:
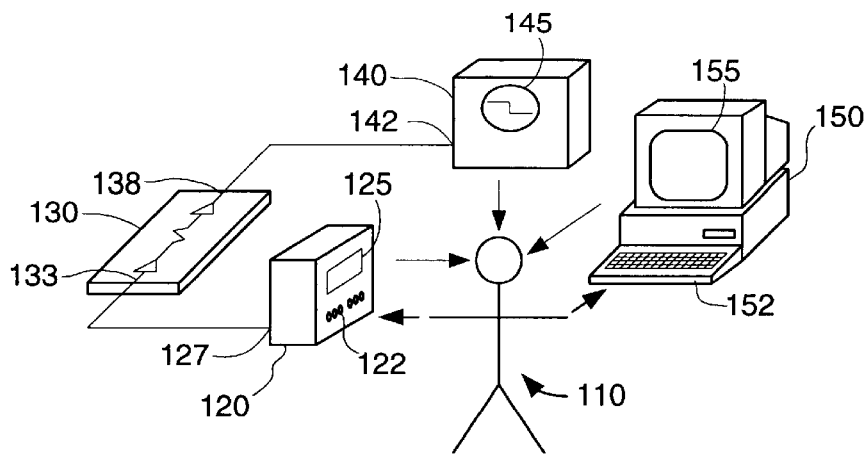
FIG. 1 is a simplified diagram showing a conventional system for measuring Vil and Vih of an integrated circuit.

The measurement system according to the present invention provides several advantages over the conventional system shown in FIG. 1 and discussed above.

First, the system shown in FIGS. 3 and 4 is convenient and reliable because it does not require a human operator to function as the system feedback, as required in the conventional system. As discussed above, the closed loop allows computer 350 to both transmit control signals to power supply 320 and receive output signals from DUT 130. Because computer 350 controls power supply 320, there is no need for a human operator to read the voltage level of the applied voltage. Also, by using parallel port 353 of computer 350 to sense the logic level of the output signal from DUT 130, Vil and Vih measurements are automatically entered into computer 350, thereby obviating the need for an operator to manually enter the Vil and Vih measurements read from an oscilloscope. Consequently, the limitations and error potential presented by including a human operator in the conventional system shown in FIG. 1 are eliminated by the system of the present invention.

Further, by using parallel port 353 of computer 350 to sense the logic level of the output signal from DUT 130, the need for an oscilloscope is eliminated. By removing the need for an oscilloscope, the system according to the present invention is significantly less expensive than that of the conventional system shown in FIG. 1.

In accordance with an embodiment of the present invention, Vil/Vih measurement software 422 is a software application prepared using the LabView graphical programming language produced by National Instruments Corporation. The LabView language allows basic control of power supply 320 via GPIB 358. For applications not utilizing the Labview language, power supply control software 429 may be required to generate the control signal transmitted to power supply 320.

Examples of the content of Vil/Vih measurement software 422 will be understood from the embodiments described below with reference to FIGS. 5 through 8.

Figure 5:
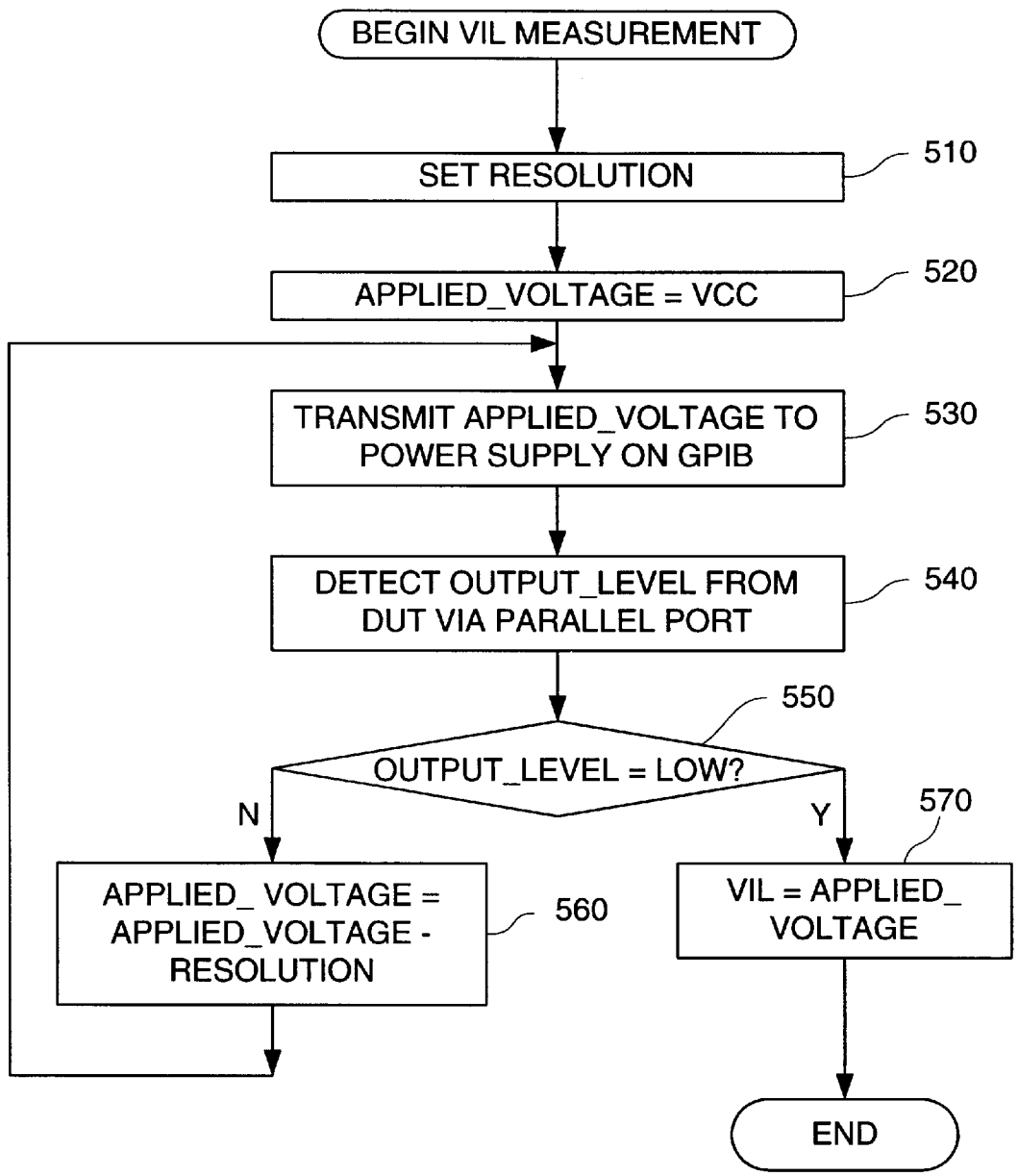
FIG. 5 is a flow diagram showing a method for measuring Vil of an integrated circuit in accordance with the present invention using a linear approach.
Figure 6:
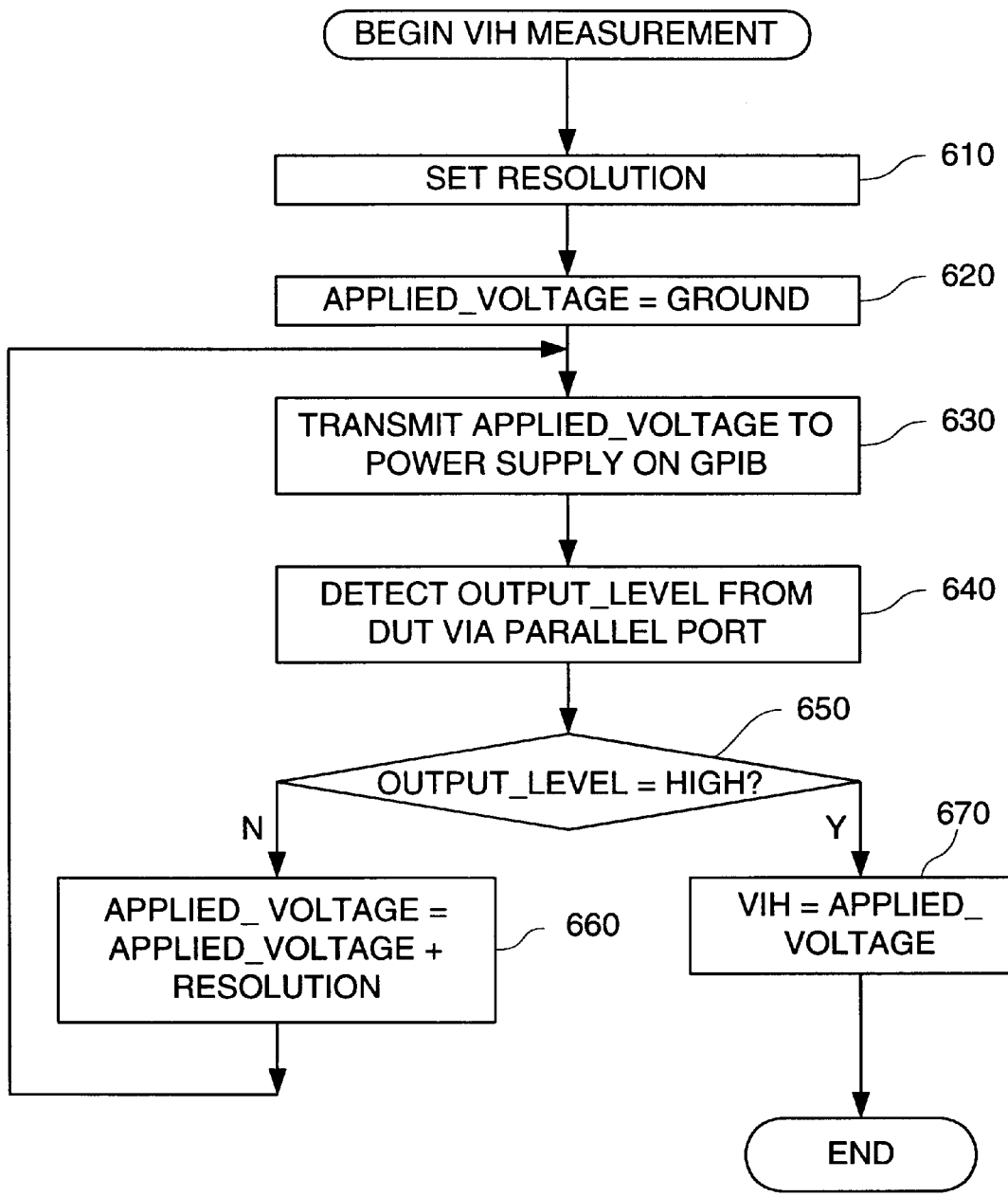
FIG. 6 is a flow diagram showing a method for measuring Vih using the linear approach.

FIGS. 5 and 6 are flow diagram showing steps associated with methods for measuring the Vil and the Vih of DUT 130, respectively, in accordance with an embodiment of the present invention. The method steps are performed in association with computer 350, and are described with reference to the system shown in FIG. 4.

Referring to FIG. 5, Step 510 is an optional step during which the resolution of the measurement process is determined, for example, by asking a user to supply a resolution value. This resolution value is then stored in RESOLUTION file 428 of memory 420. (In other embodiments, the resolution value is set to a predetermined value.) The resolution value may be, for example, a milli-Volt value in the range of 1 to 25 milli-volts (or more). As discussed below, this resolution value partially controls the number of iterations of the measurement process, and therefore is related to the time required to perform Vil measurement. Control then passes to Step 520.

In Step 520, Vil/Vih measurement software 422 sets an initial APPLIED_VOLTAGE value to VCC (e.g., 3.3 Volts) for Vil measurements. Control then passes to Step 530.

In Step 530, the control signal (including the value of APPLIED_VOLTAGE) is transmitted from CPU 410 to power supply 320 via GPIB 358 (see FIG. 4). As discussed above, this control signal causes power supply 320 to generate a corresponding applied voltage (e.g., 3.3 Volts) that is transmitted to input terminal 133 of DUT 130. In response to this applied voltage, DUT 130 generates an output signal having a high logic level that is transmitted to parallel port 353 of computer 350.

Subsequently, in Step 540, computer 350 detects the logic level (OUTPUT_LEVEL) of the output signal from DUT 130 that is applied to parallel port 353 (see FIG. 4). If this logic level is high (N in Step 550), then control passes to Step 560. If this logic level is low (Y in Step 550), then control passes to Step 570.

In Step 560, the APPLIED_VOLTAGE value stored in file 426 of memory 420 of computer 350 is incrementally decreased by subtracting the RESOLUTION value in file 428 from the previously stored APPLIED_VOLTAGE value. Control then passes back to Step 530.

The loop formed by Steps 530, 540, 550, and 560 is repeated until the applied voltage transmitted from power supply 320 causes DUT 130 to generate a logic low output signal. When this occurs (Y in Step 550), control passes to Step 570, where Vil,Vih file 427 of memory 420 (see FIG. 4) is updated to store a Vil value equal to the final APPLIED_VOLTAGE value. For example, if the actual Vil for DUT 130 is 0.88 Volts, and the RESOLUTION value is 0.10, then the initial APPLIED_VOLTAGE value of 3.3 is sequentially decreased (systematically adjusted) to the values 3.2, 3.1, 3.0 . . . 1.1, 1.0, 0.9 through sequential passes through the loop formed by Steps 530 through 560, in each case causing DUT 130 to generate a logic high output signal. Subsequently, when APPLIED_VOLTAGE changes to 0.8 and the applied voltage generated by power supply 320 changes to 0.8 Volts (i.e., below the actual Vil of DUT 130), the output signal from DUT 130 changes from a high (first) logic level to a low (second) logic level, thereby providing a positive test result in Step 550 and causing control to pass to Step 570. At this time, the Vil value stored in memory 420 is 0.8 Volts, which is substantially equal to the actual vil of DUT 130. As used herein, the term "substantially equal" means within a range determined by the resolution set for the measurement process. In the present example, the final Vil value of 0.8 is "substantially equal" to the actual Vil of 0.88 because the difference between these two values (i.e., 0.08) is less than the RESOLUTION value of 0.10.

FIG. 6 is a flow diagram showing method steps for measuring the Vih of DUT 130 using the linear approach utilized to measure Vil in FIG. 5. Specifically, Steps 610, 630, and 640 are identical to corresponding Steps 510, 530 and 540 of FIG. 5. The method of measuring Vih (FIG. 6) differs from the method of measuring Vil (FIG. 5) in that the initial APPLIED_VOLTAGE value is set to ground (e.g., 0 Volts) in Step 620 (compared to VCC in Step 520), and in that the test for completion (Step 650) determines whether the OUTPUT_LEVEL of the detected output signal is high (instead of low). Further, the method of measuring Vih differs in that the systematic adjustment of the control signal (Step 660) includes increasing (instead of decreasing) the APPLIED_VOLTAGE value of the control signal such that power supply 320 increases the voltage level of the applied voltage by RESOLUTION amount. After each incremental increase in the APPLIED_VOLTAGE value, the control signal is retransmitted to power supply 320 and the OUTPUT_LEVEL from DUT 130 is detected. The loop formed by Steps 630, 640, 650, and 660 is repeated until the OUTPUT_LEVEL changes from a low (first) logic level to a high (second) logic level, thereby indicating that the voltage level of the applied voltage is substantially equal to the Vih of DUT 130. Subsequently, the final APPLIED_VOLTAGE value is stored as the measured Vih value in Vil/Vih file 427 of memory 420 (Step 670).

Figure 2:
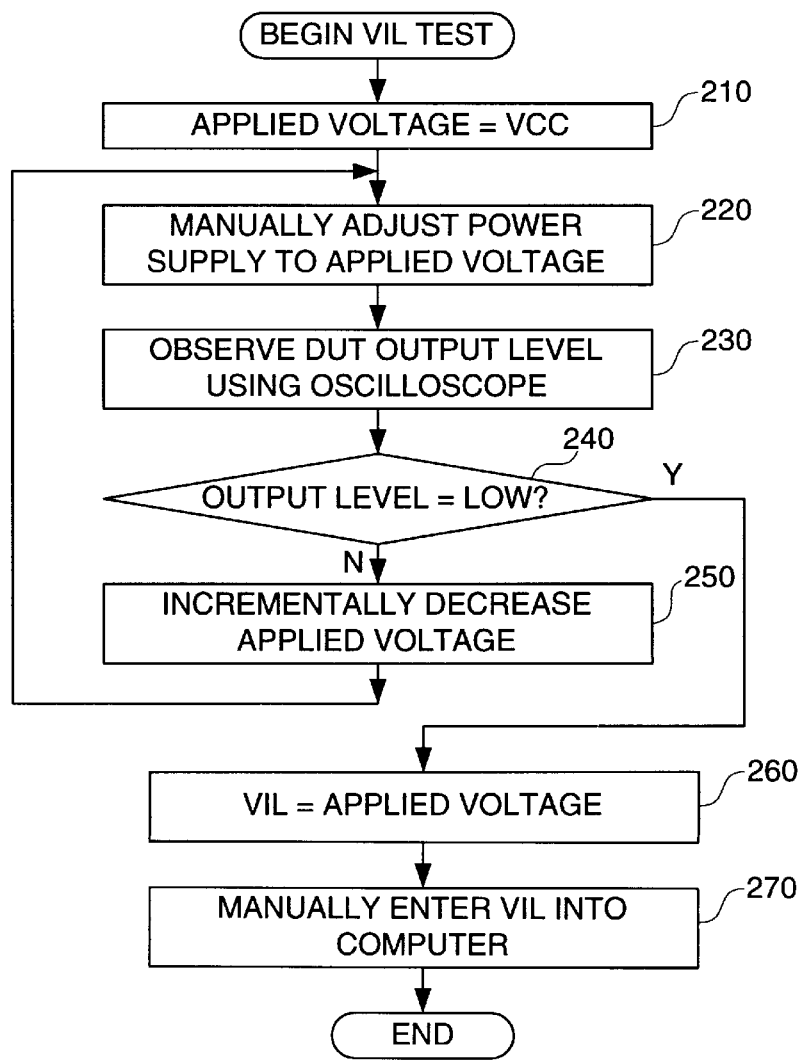
FIG. 2 is a flow diagram showing a conventional process for measuring Vil of the integrated circuit.

Although the linear approach (i.e., sequential increase/decrease of the applied voltage) used by the methods shown in FIGS. 5 and 6 provides an advantage over the conventional method shown in FIG. 2 in that it is performed automatically, the linear approach may take too long to measure Vil and Vih values for DUT 130. For example, if the initial APPLIED_VOLTAGE value is selected too high and the RESOLUTION value is too small, an extremely large number of iterations may be required before a low output signal is generated by DUT 130 during Vil measurements.

Figure 7:
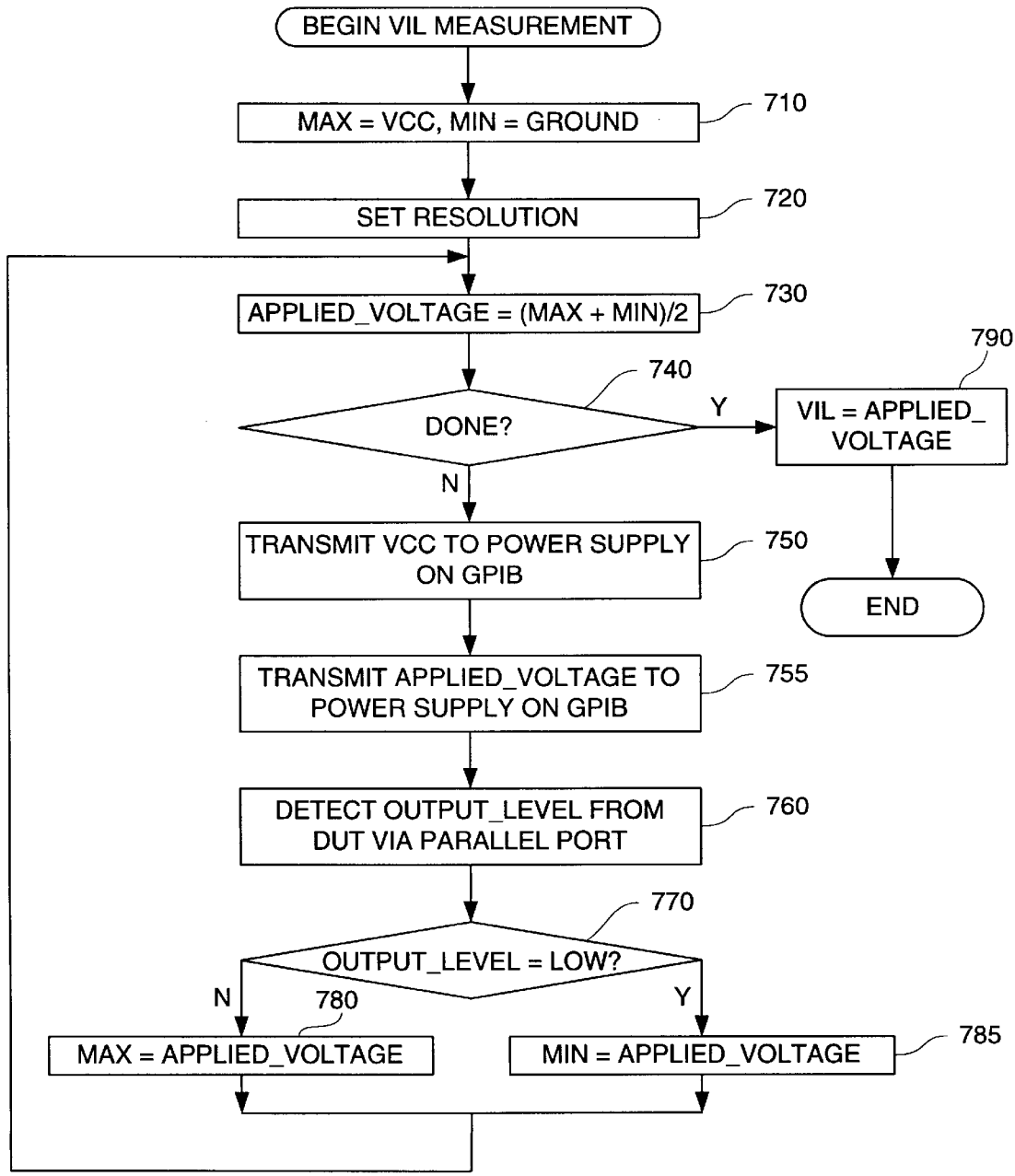
FIG. 7 is a flow diagram showing a method for measuring Vil of an integrated circuit in accordance with one embodiment of the present invention using a binary-search approach.
Figure 8:
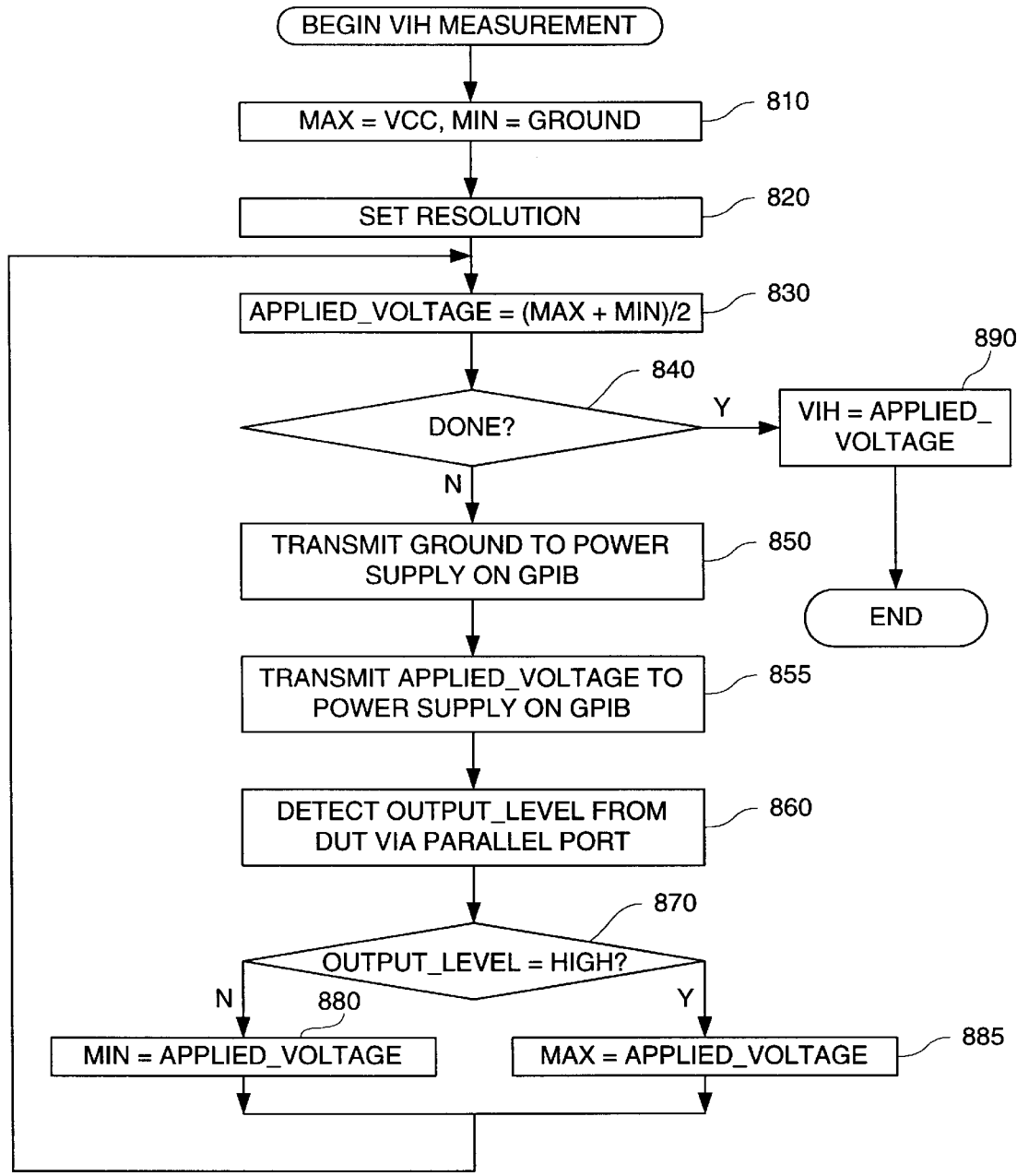
FIG. 8 is a flow diagram showing a method for measuring Vih of an integrated circuit using the binary-search approach.

FIGS. 7 and 8 are flow diagrams showing methods for measuring the Vil and the Vih, respectively, of DUT 130 in accordance with another embodiment of the present invention. The methods shown in FIGS. 7 and 8 utilize a binary-search approach, in contrast to the linear approach used in the methods of FIGS. 5 and 6. As described below, the binary-search approach systematically adjusts (i.e., adds to or subtracts from) the APPLIED_VOLTAGE value and measures the resulting output signal from DUT 130 until the APPLIED_VOLTAGE value is substantially equal to the actual Vil or Vih of DUT 130. The binary-search approach reduces the number of iterations by using relatively large adjustments to the applied voltage at the beginning of the measurement process, and gradually decreasing the adjustment amount as the measurement process proceeds.

Referring to FIG. 7, the method for measuring Vil begins by setting initial voltage levels for a MIN variable and a MAX variable according to the ground and VCC voltage levels, respectively, of DUT 130 (Step 710). For example, if VCC is 3.3 Volts and ground is 0 (zero) Volts, then the values for MIN and MAX that are stored in MIN,MAX file 425 of memory 420 (see FIG. 4) are set to 3.3 and 0 (zero), respectively. Control then passes to Step 720.

Step 720 is an optional step during which the resolution of the measurement process is determined, for example, by asking a user to supply a value. This resolution value is then stored in RESOLUTION file 428 of memory 420 (see FIG. 4). In the present example, the resolution may be a milli-Volt value (e.g., in the range of 1 to 25 milli-Volts) or a count value used to control the number of iterations. As discussed below, these resolution values control the time required to perform Vil measurement. Control then passes to Step 730.

In Step 730, Vil/Vih measurement software 422 calculates the APPLIED_VOLTAGE value in accordance with the equation:

$$APPLIED\_VOLTAGE=(MAX+MIN)/2$$

During a first pass through Step 730, an initial APPLIED_VOLTAGE value is determined by the VCC and ground voltage values associated with DUT 130. For example, when MAX is set to 3.3 (VCC) and MIN is set to 0 (ground), the initial value of APPLIED_VOLTAGE is set to 1.65. Control then passes to Step 740.

Step 740 is a resolution test that determines whether the measurement process is completed. Several methods may be used to determine whether an adequate resolution has been achieved (i.e., a "Y" result in Step 740), some of which are now described.

In one embodiment, the RESOLUTION value set in Step 720 is a milli-Volt value, and the test for ending the Vil measurement process is repeated until a difference between the MAX and MIN values is less than the RESOLUTION value. Alternatively, the test for ending the Vil measurement process may be repeated until a difference between one of the MAX and MIN values and the APPLIED_VOLTAGE value is less than the RESOLUTION value.

In yet another embodiment, the RESOLUTION value is an integer (count value) N, and the Vil measurement process is repeated until the control signal is transmitted (Step 755) a number of times equal to the RESOLUTION value. In this embodiment, adjusting the count value N controls the resolution of the measurement process. For example, assuming VCC is 3.3 Volts and ground is 0 Volts, when N=11 the resolution approaches 1 milli-Volt (0.001 Volt), which is the smallest resolution available on a state-of-the-art power supply. In other words, the resolution is controllable by altering the count value N and, in no more than 11 measurements, the system can reach the smallest resolution possible.

In addition to the embodiments mentioned above with respect to Step 740, those of ordinary skill in the art will recognize that many other resolution tests may be utilized without changing the novel aspects of the Vil measurement methods described herein.

If the completion test is negative (N in Step 740), then control passes to Step 750.

In Step 750, a first control signal (including a value corresponding to VCC) is transmitted from CPU 410 to power supply 320 via GPIB 358 (see FIG. 4). As discussed above, the VCC value causes power supply 320 to generate a corresponding applied voltage (e.g., 3.3 Volts) that is transmitted to input terminal 133 of DUT 130. In response to this applied voltage, DUT 130 typically generates an output signal having a high logic level that is transmitted to parallel port 353 of computer 350. The high logic level generated in Step 750 is used to identify the response of DUT 130 to Step 755, as described below.

In Step 755, a second control signal (including APPLIED_VOLTAGE) is then transmitted from CPU 410 to power supply 320 via GPIB 358 (see FIG. 4). As discussed above, this control signal causes power supply 320 to generate a corresponding applied voltage (e.g., 1.65 Volts) that is transmitted to input terminal 133 of DUT 130. In response to this applied voltage, DUT 130 generates an output signal having a logic level that is transmitted to parallel port 353 of computer 350. Specifically, if the applied voltage is greater than Vil, the output signal generated by DUT 130 remains in the high logic state generated in Step 750. Conversely, if the applied voltage level is less than Vil, the output signal generated by DUT 130 switches to a low logic state.

Subsequently, in Step 760, computer 350 detects the logic level (OUTPUT_LEVEL) of the output signal from DUT 130 that is applied to parallel port 353 (see FIG. 4). If this logic level is high (N in Step 770), then control passes to Step 780. If this logic level is low (Y in Step 770), then control passes to Step 785. In steps 780 and 785, the APPLIED_VOLTAGE value is systematically adjusted in response to the detected OUTPUT_LEVEL of the output signal from DUT 130. Specifically, when the OUTPUT_LEVEL is high (N in Step 770), the MAX value is assigned the APPLIED_VOLTAGE value calculated during the immediately previous pass through Step 730. When control subsequently passes from Step 780 back to Step 730, the changed value for MAX is used to recalculate the APPLIED_VOLTAGE value. Because the APPLIED_VOLTAGE value is between the MAX and MIN values, the effect of changing MAX to the APPLIED_VOLTAGE value causes the subsequently calculated APPLIED_VOLTAGE value to be less than the previously calculated APPLIED_VOLTAGE value. Therefore, Step 780 has the effect of decreasing the APPLIED_VOLTAGE value by an amount equal to (MAX−MIN)/2. In contrast, when the OUTPUT_LEVEL is low (Y in Step 770), control passes to Step 785, and the MIN value is assigned the APPLIED_VOLTAGE value calculated during the immediately-previous pass through Step 730 (i.e., MIN is increased by (MAX−MIN)/2). When control subsequently passes from Step 785 back to Step 730, the relatively larger value of MIN is used to recalculate the APPLIED_VOLTAGE value, thereby causing the APPLIED_VOLTAGE value to be greater than the previously calculated APPLIED_VOLTAGE value. Therefore, Step 785 has the effect of increasing the APPLIED_VOLTAGE value by an amount equal to (MAX−MIN)/2.

The loop formed by Steps 730 through 785 forms a binary-search process that systematically adjusts the APPLIED_VOLTAGE value toward the actual Vil of DUT 130. During early iterations, the APPLIED_VOLTAGE value is adjusted by relatively large amounts. As the process proceeds, the amount of adjustment gradually decreases until the resolution test (Step 740) is satisfied, at which time the APPLIED_VOLTAGE value is within a predetermined range of the actual Vil of DUT 130.

Once the resolution test is satisfied (Y in Step 740), control passes to Step 790. At this time, the final APPLIED_VOLTAGE value is stored as the measured Vil value in Vil,Vih file 427 of memory 420.

The binary-search approach utilized in the Vil measurement method shown in FIG. 7 reduces the amount of time required to measure Vil by a factor of VCC/log$_2$VCC, when compared with the linear-search approach utilized in the method shown in FIG. 5. Table 1 (below) shows sample binary-search results generated by the method for measuring Vil shown in FIG. 7. Table 1 includes, for each iteration (I), generated values for MIN, MAX, and APPLIED_VOLTAGE (AV), generated test results for Steps 740 and 770, and an incremental change (Adjustment) to the APPLIED_VOLTAGE value. The sample results are generated based on an actual Vil of 0.88 Volts, a VCC of 3.3 Volts, and a ground value of 0 Volts. When a RESOLUTION value of 0.10 Volts is used, Step 740 is satisfied (indicated by Y1) after five iterations (i.e., the final Adjustment amount equals the RESOLUTION value of 0.10 Volts). Further, when a RESOLUTION value of 0.01 Volts is used, Step 740 is satisfied (indicated by Y2) after eight iterations (i.e., the final Adjustment amount equals the RESOLUTION value of 0.01 Volts). The rapid convergence of the APPLIED_VOLTAGE value to the actual Vil is illustrated by the Adjustment values in Table 1. Specifically, the Adjustment value decreases from 1.65 Volts to 0.10 Volts in five iterations, and to 0.01 Volts in eight iterations.

TABLE 1

| I | MAX (V) | MIN (V) | AV (V) | Step 770 | Adjustment (V) | Step 740 |
|---|---------|---------|--------|----------|----------------|----------|
| 1 | 3.300   | 0.000   | 1.650  | N        | 1.650          | N        |
| 2 | 1.650   | 0.000   | 0.825  | Y        | 0.825          | N        |
| 3 | 1.650   | 0.825   | 1.238  | N        | 0.413          | N        |
| 4 | 1.238   | 0.825   | 1.031  | N        | 0.206          | N        |
| 5 | 1.031   | 0.825   | 0.928  | N        | 0.103          | Y1       |
| — | —       | —       | —      | —        | —              | —        |
| 6 | 0.928   | 0.825   | 0.876  | Y        | 0.052          | N        |
| 7 | 0.928   | 0.876   | 0.902  | N        | 0.026          | N        |
| 8 | 0.902   | 0.876   | 0.889  | N        | 0.013          | Y2       |

In contrast to the binary-search results shown in Table 1, when a RESOLUTION value of 0.10 Volts is used in the linear-search approach shown in FIG. 5, more than 20 iterations are needed before the APPLIED_VOLTAGE value is substantially equal to the actual Vil. Moreover, a RESOLUTION value of 0.01 Volts requires more than 200 iterations before the APPLIED_VOLTAGE value is substantially equal to the actual Vil. When compared to the linear-search approach, the binary-search approach reduces the amount of time required to measure Vil by a factor of VCC/log$_2$VCC.

FIG. 8 is a flow diagram showing method steps for measuring the Vih of DUT 130 using the binary-search approach utilized to measure Vil in FIG. 7. Specifically, Steps 810, 820, 830, 840, 855, and 860 are identical to Steps 710, 720, 730, 740, 755, and 760 of FIG. 7. The method of measuring Vih (FIG. 8) differs from the method of measuring Vil (FIG. 7) in that a GROUND value is transmitted to power supply 320 in Step 850 (instead of VCC, as in Step 750), and in that the test for completion (Step 870) determines whether the OUTPUT_LEVEL of the detected output signal is high (instead of low). After each adjustment of the APPLIED_VOLTAGE value (Step 830) following adjustment of either the MIN value or the MAX value, the control signal is retransmitted to power supply 320 and the OUTPUT_LEVEL from DUT 130 is detected. The loop formed by Steps 830 to 885 is repeated until the resolution test in Step 840 is satisfied, thereby indicating that the voltage level of the applied voltage is substantially equal the Vih of DUT 130. Subsequently, the final APPLIED_ VOLTAGE value is stored as the measured Vih value in Vil/Vih file 427 of memory 420 (Step 890).

When used in conjunction with the system shown in FIGS. 3 and 4, the methods shown in FIGS. 5 through 8 of the present invention are more accurate than the prior art methods for several reasons. First, the resolution of these methods is controllable and, in the case of the binary-search approach utilized in the methods of FIGS. 7 and 8, achieves maximum resolution within a few steps. To double the resolution, the methods only need to include one additional iteration. The methods automatically and iteratively monitor the output voltage, adjust the input voltage, and write the results to the computer, thereby avoiding errors that a human operator might make in the highly repetitious and tedious conventional method shown in FIG. 2. Finally, these methods do not encounter the issue of ground differential between the power supply and the oscilloscope that occurs in the conventional method, because the oscilloscope is not used to measure the output signal generated by DUT 130.

Although the present invention has been described in considerable detail with reference to certain preferred embodiments thereof, one of ordinary skill would recognize that several variations to the disclosed embodiments are possible. For example, terminals other than the GPIB and parallel port of a computer may be used to provide the necessary connections with the power supply and DUT. Further, an oscilloscope or other measuring device may be connected to the loop shown in FIG. 3, but such other measuring device may significantly reduce the operating speed of the system and introduce errors. In addition, other equations may be used to calculate adjustments to the MIN and MAX values in Steps 780 and 785 (FIG. 7) and Steps 880 and 885 (FIG. 8). For example, the adjustment amount may be calculated using $VCC/2^I$, where I is the iteration number. The adjustment may also be determined by calculating the absolute value of a difference between the APPLIED_VOLTAGE value of a previous iteration and the APPLIED_VOLTAGE value of a current iteration. Moreover, other methods of calculating Vil and Vih may be utilized by the measurement system of the present invention (i.e., instead of the linear and binary-search approaches described above). Therefore, the spirit and scope of the appended claims should not be limited to the description of the specific embodiments contained herein.

I claim:

1. A system for measuring at least one of Vil and Vih of an integrated circuit, the integrated circuit including an input terminal, an output terminal, and internal circuitry connected between the input terminal and the output terminal, wherein when an applied voltage at the input terminal is lower than Vil, a corresponding logic low output level is generated by the internal circuitry at the output terminal, and when the applied voltage at the input terminal is greater than Vih, a corresponding logic high output level is generated at the output terminal, the system comprising:

a computer including an input terminal and an output terminal; and a power supply having an input terminal connected to the output terminal of the computer, the power supply including internal circuitry for transmitting the applied voltage to the input terminal of the integrated circuit, the voltage level of the applied voltage being determined by a control signal generated by the computer on the output terminal of the computer;

wherein the output terminal of the integrated circuit is connected to the input terminal of the computer; and wherein the computer includes means for repeatedly detecting a change in a logic level of an output signal transmitted from the output terminal of the integrated circuit to the input terminal of the computer, and means for repeatedly systematically adjusting the control signal transmitted to the power supply in response to the detected logic level of the output signal until the applied voltage is within a predefined resolution valve of to one of the Vil and the vih of the integrated circuit.

2. The system according to claim 1, wherein the input terminal o f the computer is a parallel port.

3. The system according to claim 1, wherein the output terminal of the computer is a general purpose interface bus.

4. The system according to claim 1, wherein the means for detecting the change in the logic level of the output signal from the integrated circuit comprises a central processing unit controlled by a software program to compare a stored logic level with the logic level of the output signal from the integrated circuit.

5. The system according to claim 1, wherein the means for systematically adjusting the control signal transmitted to the power supply comprises a central processing unit controlled by a software program such that the control signal is systematically adjusted according to predetermined criteria until the logic level of the output signal changes from a first logic level to a second logic level.

6. A method for measuring at least one of Vil and Vih of an integrated circuit, the integrated circuit including an input terminal, an output terminal, and internal circuitry connected between the input terminal and the output terminal, wherein when an applied voltage at the input terminal is lower than Vil, a corresponding logic low output level is generated by the internal circuitry at the output terminal, and when the applied voltage at the input terminal is greater than Vih, a corresponding logic high output level is generated at the output terminal, the method comprising:

transmitting a control signal from a computer to a power supply such that the power supply transmits an applied voltage to the input terminal of the integrated circuit, wherein the applied voltage has a voltage level that is determined by the control signal;

detecting a logic level of an output signal transmitted from the output terminal of the integrated circuit at an input terminal of the computer; and systematically adjusting the control signal in response to the detected logic level while repeating the steps of transmitting and detecting until the voltage level of the applied voltage is within a predefined resolution valve of one of the Vil and the Vih of the integrated circuit.

7. The method according to claim 6, wherein transmitting the control signal comprises passing the control signal from a central processing unit of the computer to a general purpose interface bus of the computer, the general purpose interface bus being connected by a cable to an input terminal of the power supply.

8. The method according to claim 6, wherein detecting the logic level of the output signal includes passing the output signal from the integrated circuit through a parallel port of the computer to a central processing unit of the computer.

9. The method according to claim 6, wherein systematically adjusting the control signal comprises changing the control signal such that the power supply decreases the voltage level of the applied voltage by a predetermined amount, until the logic level of the detected output voltage changes from a high logic level to a low logic level, thereby causing the voltage level of the applied voltage to substantially equal the Vil of the integrated circuit.

10. The method according to claim 6, wherein systematically adjusting the control signal comprises changing the control signal such that the power supply increases the voltage level of the applied voltage by a predetermined amount, until the logic level of the detected output voltage changes from a low logic level to a high logic level, thereby causing the voltage level of the applied voltage to substantially equal the Vih of the integrated circuit.

11. The method according to claim 6, wherein systematically adjusting the control signal comprises:
    comparing the logic level of the output signal with a predetermined voltage level;
    changing the control signal such that the power supply increases the voltage level of the applied voltage if the logic level of the output signal is less than the predetermined voltage level; and
    changing the control signal such that the power supply decreases the voltage level of the applied voltage if the logic level of the output signal is greater than the predetermined voltage level.

12. The method according to claim 11,
wherein transmitting the control signal includes calculating a value APPLIED_VOLTAGE for the control signal using the equation:

$$APPLIED\_VOLTAGE=(MAX+MIN)/2,$$

where MAX and MIN are variables having initial values set to VCC and ground voltage levels of the integrated circuit, respectively, and wherein changing the control signal such that the power supply increases the voltage level of the applied voltage comprises:
    changing the value of MIN to equal APPLIED_VOLTAGE, and
    recalculating APPLIED_VOLTAGE using the changed value of MIN.

13. The method according to claim 12, wherein changing the control signal such that the power supply decreases the voltage level of the applied voltage comprises:
    changing the value of MAX to equal APPLIED_VOLTAGE, and
    recalculating APPLIED_VOLTAGE using the changed value of MAX.

14. The method according to claim 13, wherein the steps of changing the values of MAX and MIN, and the step of recalculating APPLIED_VOLTAGE are repeated until a difference between MAX and MIN is less than a predetermined amount.

15. The method according to claim 11, wherein comparing the logic level of the output signal comprises determining if the logic level is equal to a logic low level.

16. The method according to claim 11, wherein comparing the logic level of the output signal comprises determining if the logic level is equal to a logic high level.

17. The method according to claim 6, wherein systematically adjusting the control signal is repeated a predetermined number of times.

* * * * *